United States Patent
Lee et al.

(10) Patent No.: US 9,142,577 B2
(45) Date of Patent: Sep. 22, 2015

(54) PHOTODETECTOR AND IMAGE SENSOR INCLUDING THE SAME

(71) Applicant: SAMSUNG ELECTRONICS CO., LTD., Suwon-si, Gyeonggi-do (KR)

(72) Inventors: HyunSeok Lee, Hwaseong-si (KR); Jung-Kyu Jung, Seoul (KR); Yoondong Park, Osan-Si (KR); Taeyon Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/092,257

(22) Filed: Nov. 27, 2013

(65) Prior Publication Data

US 2014/0159128 A1 Jun. 12, 2014

(30) Foreign Application Priority Data

Dec. 11, 2012 (KR) .......................... 10-2012-0143715

(51) Int. Cl.
*H01L 27/14* (2006.01)
*H01L 27/146* (2006.01)
(Continued)

(52) U.S. Cl.
CPC .... *H01L 27/14601* (2013.01); *H01L 27/14605* (2013.01); *H01L 27/14614* (2013.01); *H01L 31/02327* (2013.01); *H01L 31/09* (2013.01); *H04N 5/332* (2013.01); *H04N 5/3745* (2013.01)

(58) Field of Classification Search
CPC ................... H01L 27/14601; H01L 31/02327; H01L 31/09; H01L 27/14605; H01L 27/14614; H01L 27/14607; H01L 27/14612; H01L 31/10; H04N 5/3745; H03N 5/332

USPC ............. 257/21, 80, 184, 187, 192, 225, 228, 257/414, 428, 431, 432, 462, E31.053, 257/E31.073, E31.079
See application file for complete search history.

(56) References Cited

U.S. PATENT DOCUMENTS 5,408,121 A 4/1995 Nakamura et al.
6,140,646 A 10/2000 Busta et al.
(Continued)

FOREIGN PATENT DOCUMENTS

JP 2004-214383 A 7/2004
JP 2010-223700 A 10/2010
KR 10-2011-0062043 A 6/2011

OTHER PUBLICATIONS

Zhu et al. High-Resolution Plasmonic Refractive Index Sensor Based on a Metal-Insulator-Metal Structure. Chin. Phys. Lett., vol. 28, No. 4 (2011), pp. 054205-1-054205-4.*
(Continued)

*Primary Examiner* — Galina Yushina
(74) *Attorney, Agent, or Firm* — Lee & Morse, P.C.

(57) ABSTRACT

A photodetector may have a structure including conductive patterns and an intermediate layer interposed between the conductive patterns. A length L of at least one side of the second conductive pattern that overlaps the first conductive pattern and the intermediate layer satisfies the equation $L=\lambda/2n_{eff}$, wherein the $n_{eff}$ is an effective refractive index of a surface plasmon waveguide formed of the first conductive pattern, the intermediate layer, and the second conductive pattern during a surface plasmon resonance. Heat generated in the intermediate layer when the electromagnetic wave having the wavelength λ is incident thereon generates a current variation.

18 Claims, 16 Drawing Sheets

(51) Int. Cl.
*H01L 31/0232* (2014.01)
*H01L 31/09* (2006.01)
*H04N 5/33* (2006.01)
*H04N 5/3745* (2011.01)

(56) References Cited

U.S. PATENT DOCUMENTS

| | | | |
|---|---|---|---|
| 6,465,784 | B1 | 10/2002 | Kimata |
| 7,489,024 | B2 | 2/2009 | Socher et al. |
| 7,705,306 | B2 | 4/2010 | Komiyama et al. |
| 7,825,379 | B2 | 11/2010 | Nakaki |
| 8,193,497 | B2 | 6/2012 | Park et al. |
| 8,212,212 | B2 | 7/2012 | Park et al. |
| 8,338,902 | B2 | 12/2012 | Kwon et al. |
| 2010/0019296 | A1* | 1/2010 | Cha et al. .............. 257/292 |
| 2011/0075962 | A1* | 3/2011 | Block ..................... 385/12 |
| 2011/0193940 | A1 | 8/2011 | Park et al. |
| 2012/0132804 | A1 | 5/2012 | Lee et al. |

OTHER PUBLICATIONS

Cattoni et al. lambda/1000 Plasmonic Nanocacities for Biosensing Fabricated by Soft UN Nanoimrint Lithography. NANOLETTERS, 2011, 11, pp. 3557-3563.*
Liu et al. Infrared Perfect Absorber and Its Application as Plasmonic Sensor. NANOLETTERS, 2010, 10, pp. 2342-2348.*
P3012~3015, Optics Letters / vol. 34, No. 19 / Oct. 1, 2009.
P37668~P3769, Optics Letters / vol. 35, No. 22 / Nov. 15, 2010.
Wang, et al. "Photothermal reshaping of gold nanoparticles in a plasmonic absorber;" Jul. 2011 / vol. 19, No. 15 / Optics Express 14726~14734.
Cattoni, et al. "$\lambda^3$/1000 Plasmonic Nanocavities for Biosensing Fabricated by Soft UV Nanoimprint Lithography;" Nano Lett. 2011, 11, 3557-3563.

* cited by examiner

PHOTODETECTOR AND IMAGE SENSOR INCLUDING THE SAME

CROSS-REFERENCE TO RELATED APPLICATION

Korean Patent Application No. 10-2012-0143715, filed on Dec. 11, 2012, in the Korean Intellectual Property Office, and entitled: "Photodetector and Image Sensor Including the Same," is incorporated by reference herein in its entirety.

BACKGROUND

1. Field

Embodiments relate to a photodetector and an image sensor including the same.

2. Description of the Related Art

An image sensor may be a semiconductor device which converts an optical image into an electric signal. The image sensor may have a CCD (Charge Coupled Device) type or a CMOS (Complementary Metal Oxide Semiconductor) type. The CMOS type image sensor may be called a CMOS image sensor (CIS). The CIS may have a plurality of pixels two-dimensionally arranged. Each of the pixels may have a photodiode (PD). The photodiode may convert incident light into an electric signal. In recent years, there have been researched various methods for detecting light besides the photodiode.

SUMMARY

One or more embodiments are directed to providing a photodetector which includes a first conductive pattern and a second conductive pattern sequentially stacked. and an intermediate layer interposed between the first conductive pattern and the second conductive pattern. The intermediate layer is configured to detect an electromagnetic wave having a wavelength λ incident thereon, wherein a length L of at least one side of the second conductive pattern that overlaps the first conductive pattern and the intermediate layer satisfies equation 1, $$L = \lambda / 2 n_{eff} \qquad (1)$$

wherein the $n_{eff}$ is an effective refractive index of a surface plasmon waveguide formed of the first conductive pattern, the intermediate layer, and the second conductive pattern during a surface plasmon resonance, and wherein heat generated in the intermediate layer by the electromagnetic wave through a surface plasmon focusing phenomenon causes a variation in the intermediate layer such that a varied current is detected.

The intermediate layer may be one of silicon, germanium, poly silicon, poly germanium, amorphous silicon, amorphous germanium, silicon oxide, silicon nitride, silicon oxide nitride, and an amorphous or crystalline phase change film including a Chalcogenide element.

A real value of a dielectric constant of the first and second conductive patterns at the wavelength λ of the electromagnetic wave may be a negative number.

The first and second conductive patterns may be formed of at least one of gold, aluminum, silver, tungsten, copper, impurity-doped silicon, metal silicide, and crystalline alloy including a Chalcogenide element.

The first conductive pattern may include a first conductive sub-pattern and a second conductive sub-pattern spaced apart and isolated from each other, wherein the second conductive pattern and the intermediate layer overlap both the first conductive sub-pattern and the second conductive sub-pattern, and wherein the variation in the intermediate layer is a variation in resistance of the intermediate layer between the first conductive sub-pattern and the second conductive pattern and between the second conductive sub-pattern and the second conductive pattern.

The photodetector may include a source electrode and a drain electrode adjacent to both sides of the intermediate layer, respectively, and spaced apart from the first and second conductive patterns, and a gate insulation film interposed between the first conductive pattern and the intermediate layer or between the second conductive pattern and the intermediate layer.

The photodetector may include a substrate including a unit pixel area formed of a plurality of sub pixel areas, wherein the first conductive pattern, the intermediate layer, and the second conductive pattern are disposed at each of the sub pixel areas, and wherein a first length $L_1$ of a first side and a first wavelength $\lambda_1$ of the electromagnetic wave associated with a first sub pixel area are different from a second length $L_2$ of a second side and a second wavelength $\lambda_2$ of the electromagnetic wave associated with a second sub pixel area.

The first conductive pattern of the first sub pixel area may be connected with the first conductive pattern of a second sub pixel area.

The first conductive pattern may be common to all sub pixel areas.

The length L may be shorter than the wavelength λ.

The electromagnetic wave may be wave-guided along a surface between the first conductive pattern overlapping with the second conductive pattern and the intermediate layer and a surface between the second conductive pattern overlapping with the first conductive pattern and the intermediate layer by a surface plasmon phenomenon.

The variation in the intermediate layer may be in electric resistance, conductivity, dielectric constant, or charge mobility.

The second conductive pattern may be a polygonal where the second conductive pattern overlaps the first conductive layer and the intermediate layer.

The second conductive pattern may be circular where the second conductive pattern overlaps the first conductive layer and the intermediate layer.

The wavelength λ is a first wavelength $\lambda_1$ to be detected, the second conductive pattern having another side that overlaps the first conductive pattern and the intermediate layer that has a second length $L_2$ satisfying equation 1 for a second wavelength $\lambda_2$ to be detected.

One or more embodiments are directed to providing an image sensor that includes the photodetector, a reset transistor, a source follower transistor, a selection transistor and a transfer transistor electrically connected with the photodetector to transfer the varied current.

The image sensor may include a micro lens disposed on the photodetector.

No color filter is between the micro lens and the photodetector.

One or more embodiments are directed to providing a photodetector, including a first conductive pattern, an intermediate layer on the first conductive pattern, the intermediate layer configured to detect an electromagnetic wave having a wavelength λ incident thereon, and a second conductive pattern on the intermediate layer, the second conductive pattern covering a smaller surface area than the first conductive pattern and the intermediate layer, wherein a length L of at least one side of the second conductive pattern that overlaps the first conductive pattern and the intermediate layer satisfies equation 1, $$L=\lambda/2n_{eff} \qquad (1)$$

wherein the $n_{eff}$ is an effective refractive index of a surface plasmon waveguide formed of the first conductive pattern, the intermediate layer, and the second conductive pattern during a surface plasmon resonance, and wherein heat generated in the intermediate layer, when the electromagnetic wave having the wavelength λ is incident thereon, generates a current variation.

The wavelength λ may be a first wavelength $\lambda_1$ in a range of electromagnetic wavelengths to be detected, the second conductive pattern having another side having a second length $L_2$ satisfying equation 1 for a second wavelength $\lambda_2$ in the range of electromagnetic wavelengths to be detected.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
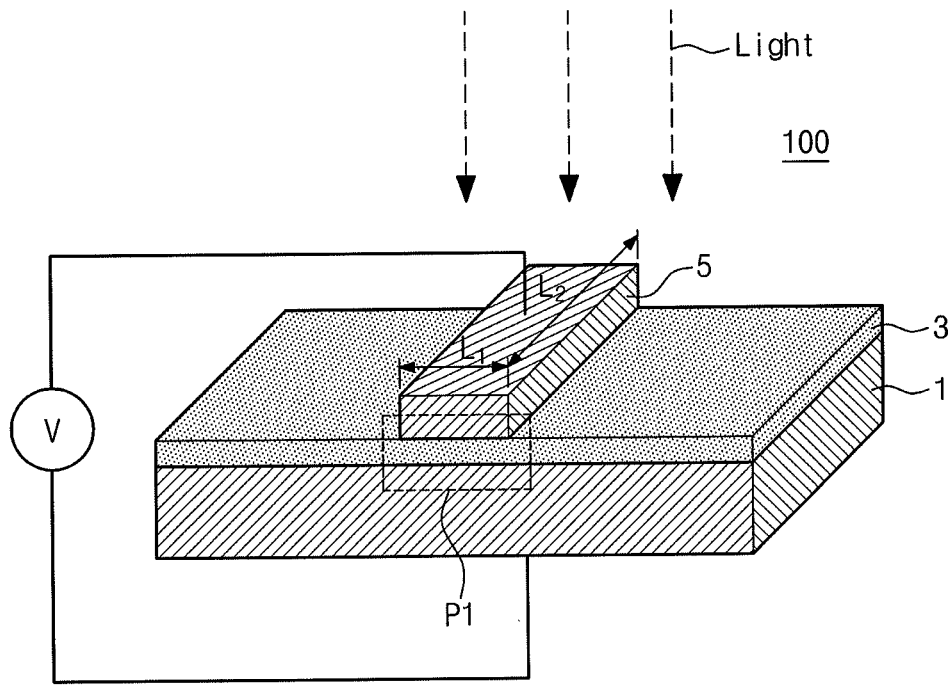
FIG. 1A illustrates a perspective view of a photodetector according to a first embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. Accordingly, known processes, elements, and techniques are not described with respect to some of the embodiments. Unless otherwise noted, like reference numerals denote like elements throughout the attached drawings and written description, and thus descriptions will not be repeated. In the drawings, the sizes and relative sizes of layers and regions may be exaggerated for clarity It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1A illustrates a perspective view of a photodetector according to a first embodiment. Referring to FIG. 1A, a photodetector 100 may include a first conductive pattern 1, a second conductive pattern 5, and an intermediate layer 3 interposed between the first and second conductive patterns 1 and 5. The first conductive pattern 1 and the second conductive pattern 5 may be vertically stacked, i.e., along a direction on which light to be detected is incident.

The intermediate layer 3 may be one of silicon, poly silicon, poly germanium, amorphous silicon, amorphous germanium, silicon oxide, silicon nitride, silicon oxide nitride, and amorphous or crystalline phase change film including Chalcogenide element. Light may be incident onto the intermediate layer 3, e.g., both through the second consecutive pattern and directly.

As used herein, light is to mean electromagnetic waves in a broad sense, i.e., is not limited to visible light in the wavelength range of about 400 nm to 700 nm. The electromagnetic waves may be divided into radio waves, infrared light, visible light, ultraviolet rays, X-rays, gamma rays, and so on according to wavelengths. Light incident onto the intermediate layer 3 may include electromagnetic waves having a plurality of wavelengths. For example, sunlight may include visible light having wavelengths of about 400 nm to 700 nm, infrared rays having a wavelength longer than a wavelength of about 700 nm, and ultraviolet rays having wavelengths of about 100 Å to 3800 Å.

Figure 1B:
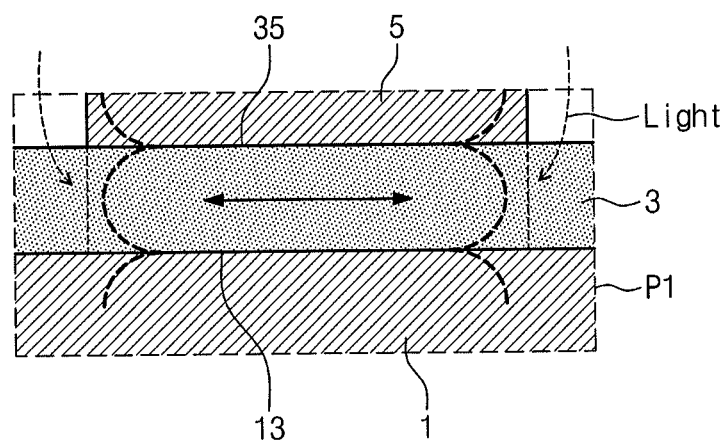
FIGS. 1B and 1C illustrate expanded cross-sectional views of a portion of FIG. 1A and show the principle of a photodetector.
Figure 1C:
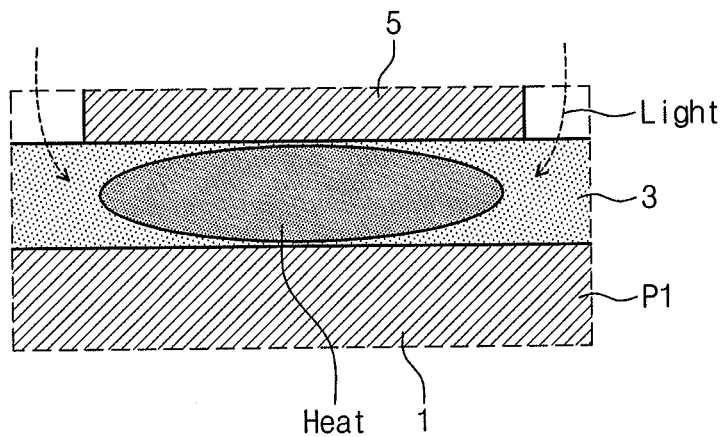

FIGS. 1B and 1C illustrate expanded cross-sectional views of a portion P1 of FIG. 1A and show the principle of a photodetector. Referring to FIGS. 1A and 1B, a length L of at least one side of the second conductive pattern 5 overlapping the first conductive pattern 1 and a wavelength λ of light may satisfy the following equation 1.

$$2n_{eff}L = \lambda \quad (1)$$

In the equation 1, "$n_{eff}$" is an effective refractive index of a surface plasmon waveguide mode formed of the first conductive pattern 1, an intermediate layer 3, and the second conductive pattern 5.

In this specification, the second conductive pattern 5 may include a width side having a first length L1 and a length side having a second length L2. The width side and the length side may overlap with the first conductive pattern 1. Light may include electromagnetic waves having a plurality of wavelengths λ1 to λm. The equation 2 may be obtained by applying them to the equation 1.

$$2n_{eff}L1 = \lambda 1, \ 2n_{eff}L2 = \lambda 2 \quad (2)$$

Here, "L1" and "L2" may be desirably shorter than wavelengths λ1 and λ2 to be detected. In this case, as illustrated in FIG. 1B, light may be diffracted at sides of the second conductive pattern 5 to be incident into the intermediate layer.

A dielectric constant of the first conductive pattern 1 and the second conductive pattern 5 may be expressed by the following equation 3.

$$\in = \in' + \in'' \quad (3)$$

In the equation 3, "$\in'$" may correspond to a real number value and "$\in''$" may correspond to an imaginary number value. The real number value $\in''$ of the dielectric constant of the first conductive pattern 1 and the second conductive pattern 5 has to be a negative number value for generation of surface plasmon resonance. The first and second conductive patterns 1 and 5 satisfying such a condition may be formed of at least one of gold, aluminum, silver, tungsten, copper, impurity-doped silicon, metal silicide, and crystalline alloy including Chalcogenide element.

If electromagnetic waves are incident onto the intermediate layer 3 between the first and second conductive patterns 1 and 5, a length of a side and a wavelength of light satisfy the equation 1 or 2, and the dielectric constant of the first and second conductive patterns 1 and 5 is as described above, a surface plasmon focusing phenomenon may be generated, so that light is wave-guided along a surface 13 between the first conductive pattern 1 overlapping the second conductive pattern 5 and the intermediate layer 3 and a surface 35 between the second conductive pattern 5 overlapping the first conductive pattern 1 and the intermediate layer 3.

At this time, light may be oscillated only between the first conductive pattern 1 and the second conductive pattern 5 to form a standing wave. An electromagnetic wave having a first wavelength λ1 of wavelengths included in the light may form a standing wave in a direction of the first length L1, and an electromagnetic wave having a second wavelength λ2 of wavelengths included in the light may form a standing wave in a direction of the second length L2. Thus, light (or, electromagnetic wave) having a particular wavelength may be focused in the intermediate layer to form a waveguide cavity structure. As illustrated in FIG. 1C, Joule's heat may be generated in the intermediate layer 3 or at the surface 35 between the intermediate layer 3 and the second conductive pattern 5. Generation of the Joule's heat may cause a variation in electric resistance, conductivity, dielectric constant, or charge mobility, so that a current variation is detected.

Referring to the equation 1, a length of a side of the second conductive pattern 5 that overlaps the first conductive pattern 1 may be decreased when wavelengths to be detected decrease and increased when wavelengths to be detected increase. Thus, in the event that a photodetector 100 detects visible light, a length L1 or L2 of a side of the second conductive pattern 5 that overlaps the first conductive pattern 1 may be about 0.2 μm to 0.3 μm. Such a unit pixel of an image sensor including the photodetector 100 may have a size less than about 1 μm.

Figure 2:
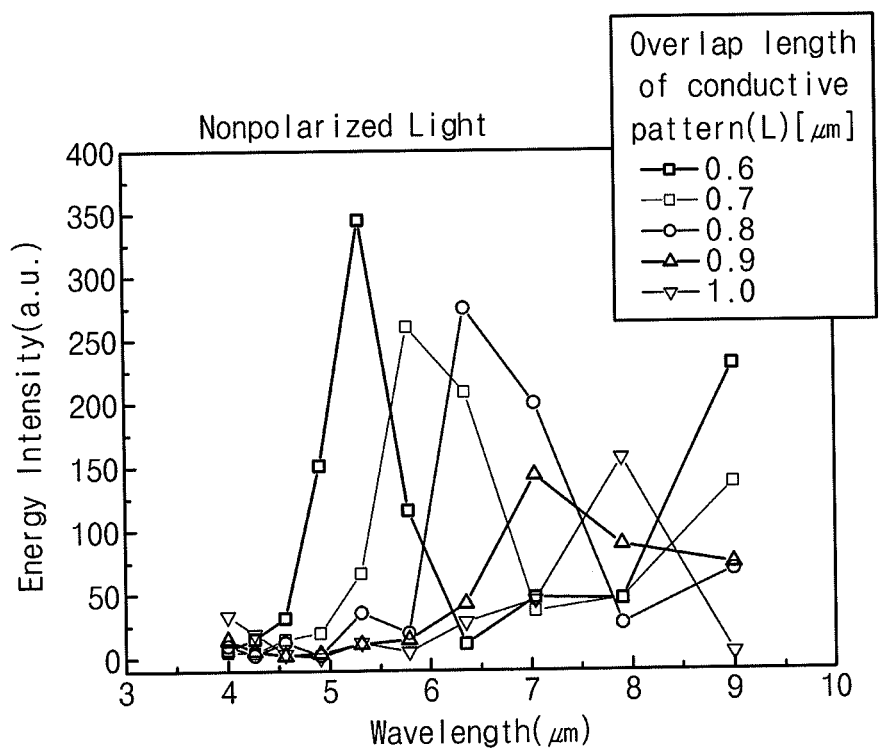
FIG. 2 illustrates a graph of a FDTD (Finite Difference Time Domain) simulation result on the wavelength and energy intensity of light absorbed by an intermediate layer according to an overlap length of a second conductive pattern.

FIG. 2 illustrates a graph illustrating a FDTD (Finite Difference Time Domain) simulation result on the wavelength and energy intensity of light absorbed by an intermediate layer according to an overlap length L of the second conductive pattern 5. Referring to FIG. 2, the wavelength and energy intensity of light absorbed by the intermediate layer 3 may be different according to an overlap length L of the second conductive pattern 5. As the length L increases, the wavelength may also be increased.

When the intermediate layer 3 is an insulation film, a photodetector 100 may be a capacitor type, and may detect a variation in capacitance according to a variation in a dielectric constant by heat. When the intermediate layer 3 is not an insulation film, but is a phase change material or an amorphous semiconductor film, the photodetector 100 may be a resistor type.

The photodetector 100 may implement a cavity for focusing light without using micro electromechanical systems (MEMS), so may be used in a microminiaturized microbolometer. Also, the photodetector 100 may detect light having various wavelengths such as visible rays, near-infrared rays, long-wave infrared rays, and so on. Also, the photodetector 100 may be easily formed using a conventional CMOS process.

Figure 3:
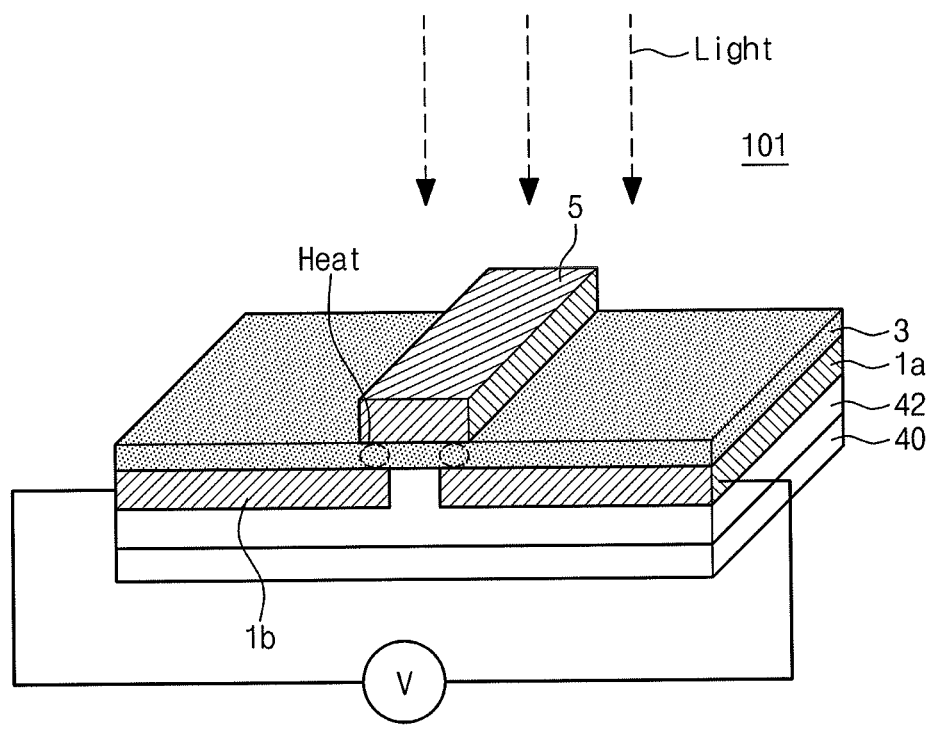
FIG. 3 illustrates a perspective view of a photodetector according to a second embodiment.

FIG. 3 illustrates a perspective view of a photodetector according to a second embodiment. Referring to FIG. 3, a photodetector 101 according to the second embodiment may include an insulation film 42 disposed on a substrate 40. A first sub-conductive pattern 1a and a second conductive sub-pattern 1b may be disposed on the insulation film 42. The first and second conductive sub-patterns 1a and 1b may be isolated by the insulation film 42 and spaced apart from each other. The intermediate layer 3 may be disposed on the first and second conductive sub-patterns 1a and 1b. The second conductive pattern 5 may be disposed on the intermediate layer 3 to be vertically overlapped with the first and second sub-conductive patterns 1a and 1b.

Correlation between lengths of sides that overlap the first and second conductive sub-patterns 1a and 1b and a wavelength of incident light may satisfy equation 1. Thus, heat may be generated in the intermediate layer 3 as illustrated in FIG. 3. In this specification, it is possible to measure a variation in current according to an electrical resistance between the first conductive sub-pattern 1a and the second conductive sub-pattern 1b. The electrical resistance may be formed by serially connecting a first resistance of the intermediate layer 3 between the first sub-conductive sub-pattern 1a and the second conductive pattern 5, a second resistance of the second conductive pattern 5, and a third resistance between the second conductive sub-pattern 1b and the second conductive pattern 5. The photodetector 101 may be similar or the same as that of the first embodiment except that it is a resistor type.

Figure 4:
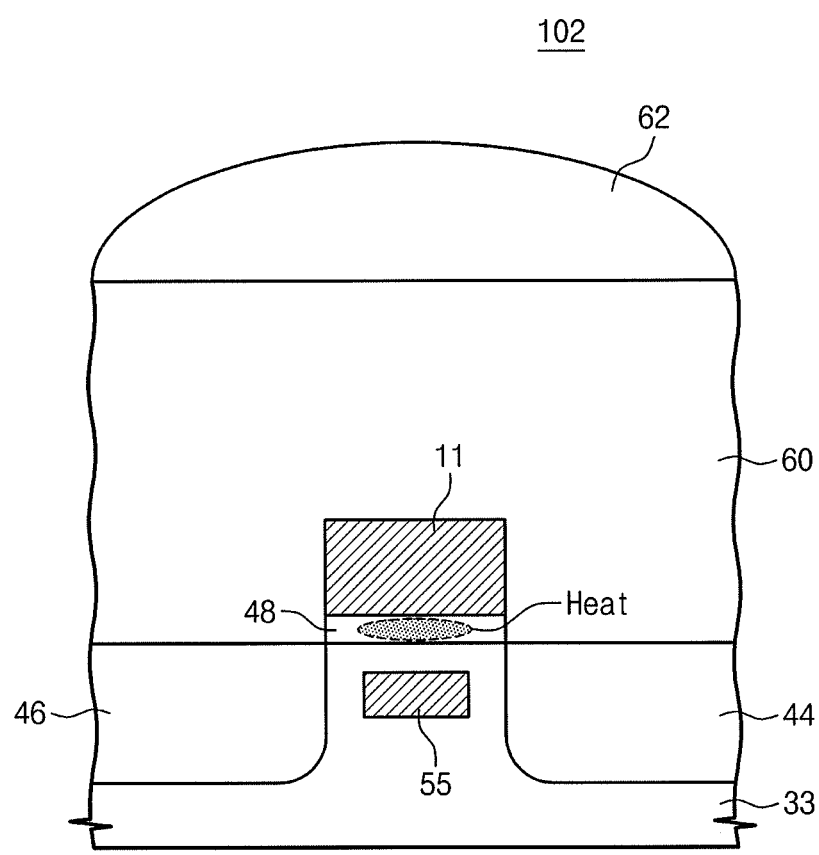
FIG. 4 illustrates a perspective view of a photodetector according to a third embodiment.

FIG. 4 illustrates a perspective view of a photodetector 102 according to a third embodiment. Referring to FIG. 4, the photodetector 102 according to a third embodiment may include a gate insulation film 48 and a gate electrode 11 stacked on a semiconductor substrate 33. A source area 44 and a drain area 46 may be disposed at the semiconductor substrate 222 corresponding to both sides of the gate electrode 11. A buried conductive pattern 55 may be formed in the semiconductor substrate 33 to be spaced apart from the gate insulation film 48, the source area 44, and the drain area 46. A channel area may be disposed between the buried conductive pattern 55 and the gate insulation film 48. The source area 44 and the drain area 46 may be formed by an impurity doping process. The semiconductor substrate 33 may be covered by an interlayer insulation film 60. A micro lens 62 may be disposed on the interlayer insulation film 60. The photodetector 102 may absorb light having a required wavelength by properly adjusting a size of a conductive pattern so as to satisfy a condition of the equation 1 using a surface plasmon phenomenon, so that a separate color filter is not required. In other words, the photodetector 102 may not include a color filter.

The gate electrode 11 may correspond to a first conductive pattern 1 of the first embodiment, and the buried conductive pattern 55 may correspond to a second conductive pattern 5 of the first embodiment. As described with reference to the first embodiment, if light is incident by the surface plasmon phenomenon, heat may be generated at the gate insulation film 48 or at the semiconductor substrate 33 adjacent to the gate insulation film 48. Although heat is not generated directly at the semiconductor substrate 33, heat generated at the gate insulation film 48 may be transferred to the semiconductor substrate 33 adjacent to the gate insulation film 48. In this case, charge mobility of the channel region may be varied, so that a variation in current is detected. The photodetector 102 according to the third embodiment may be a front gate transistor type. The third embodiment may be similar to or the same as the first embodiment except for the above description.

Figure 5:
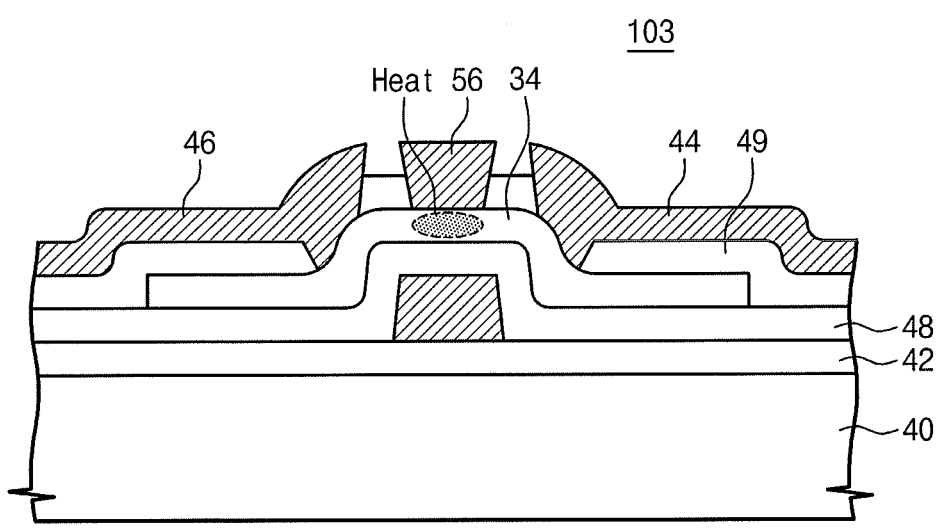
FIG. 5 illustrates a perspective view of a photodetector according to a fourth embodiment.

FIG. 5 illustrates a perspective view of a photodetector 103 according to a fourth embodiment.

Referring to FIG. 5, the photodetector 103 according to a fourth embodiment may include a first insulation film 42 disposed on a substrate 40. A gate electrode 11 may be disposed on the first insulation film 42. The gate electrode 11 may be covered by a gate insulation film 48. A channel layer 34 may be disposed on the gate insulation film 48. The channel layer 34 may be formed of amorphous semiconductor or poly silicon. The channel layer 34 may be covered by a second insulation film 49. A source electrode 44, a drain electrode 46, and an upper conductive pattern 56 may be disposed on the second insulation film 49. The source electrode 44 and the drain electrode 46 may be spaced apart from each other, and the upper conductive pattern 56 may be disposed between the source electrode 44 and the drain electrode 46. The source electrode 44 and the drain electrode 46 may be contact with the channel layer 34 at both sides of the gate electrode 11 through the second insulation film 49. The upper conductive pattern 56 may be contact with the channel layer 34 through the second insulation film 49.

The gate electrode 11 may correspond to a first conductive pattern 1 of the first embodiment, and the upper conductive pattern 56 may correspond to a second conductive pattern 5 of the first embodiment. As described with reference to the first embodiment, if light is incident by the surface plasmon phenomenon, heat may be generated at the gate insulation film 48 or at the channel layer 34 adjacent to the gate insulation film 48. Although heat is not generated directly at the channel layer 34, heat generated at the gate insulation film 48 may be transferred to the channel layer 34. In this case, charge mobility of the channel region may be varied, so that a variation in current is detected. The photodetector 103 according to the fourth embodiment may be a back gate transistor type. The fourth embodiment may be similar to or the same as the first embodiment except for the above description.

FIGS. 6A to 6D illustrate sectional plan views of photodetectors according to modified embodiments.

Figure 6A:
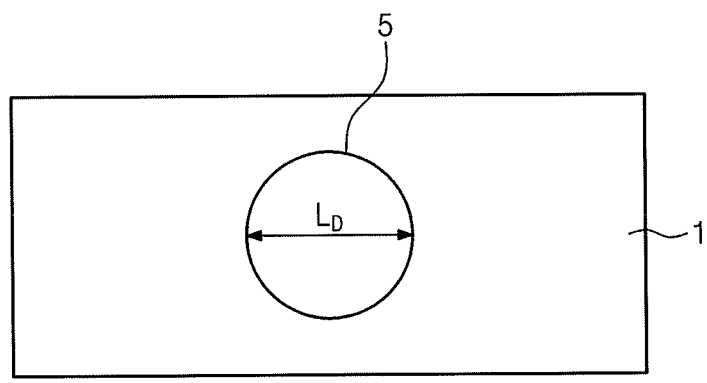
FIGS. 6A to 6D illustrate sectional plan views of photodetectors according to modified embodiments.

Referring to FIG. 6A, a photodetector according to a modified embodiment similar to that of a first embodiment, but a plane of a second conductive pattern 5 may have a circular shape. A diameter $L_D$ of the second conductive pattern 5 may correspond to "L" of the equation 1, and may satisfy correlation of the equation 1.

Figure 6B:
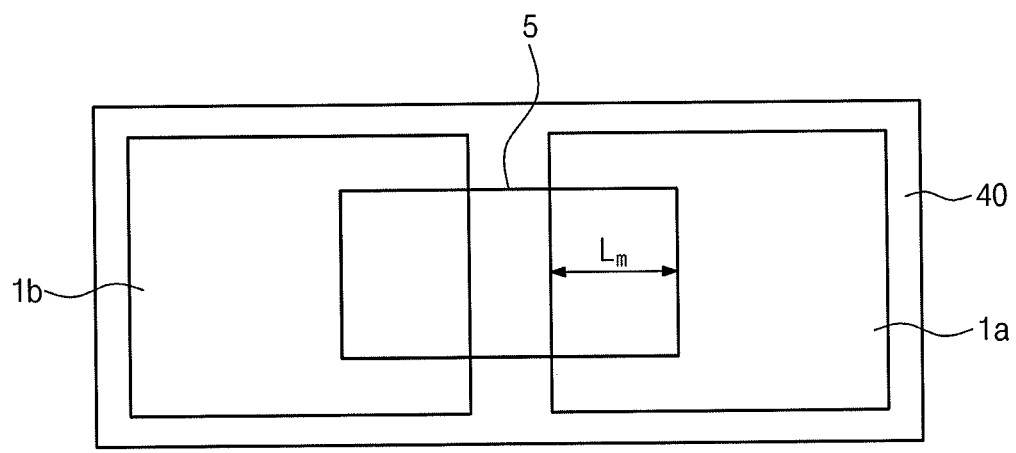
Figure 6C:
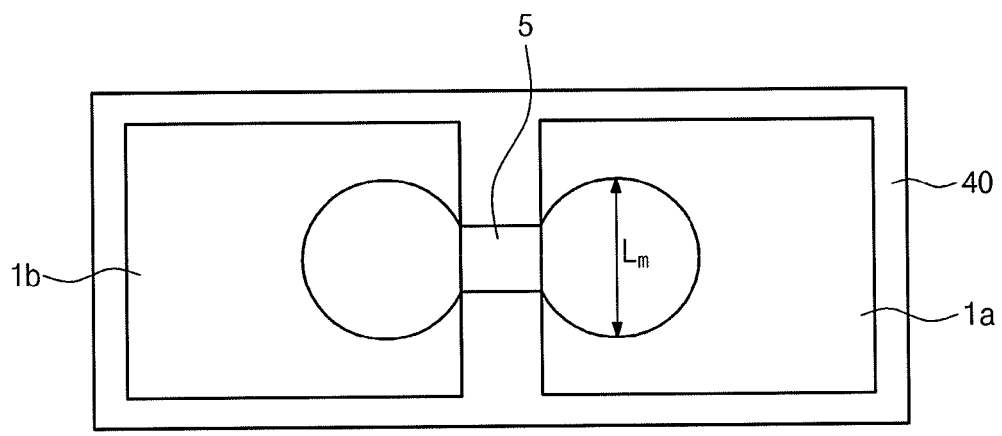
Figure 6D:
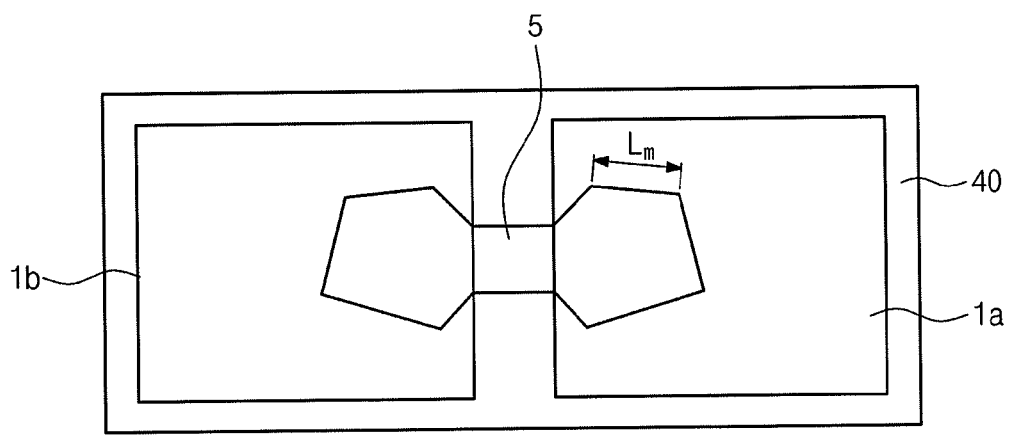

Referring to FIGS. 6B to 6D, photodetectors according to modified embodiments may be similar to that of a second embodiment, but a plane of the second conductive pattern 5 overlapped with first and second sub-conductive patterns 1a and 1b may be rectangular, circular or polygonal. A length of at least one side of the second conductive pattern 5 overlaps the first and second sub-conductive patterns 1a and 1b or a diameter $L_m$ of the second conductive pattern 5 may correspond to "L" of the equation 1, and may satisfy correlation of the equation 1, i.e., may be the circle may be considered to have a single side. In FIG. 6A or 6C, if a plane of the second conductive pattern 5 overlaps the first and second sub-conductive patterns 1, 1a and 1b is circular, unpolarized light may be focused. Thus, photosensitivity may be improved.

Figure 7:
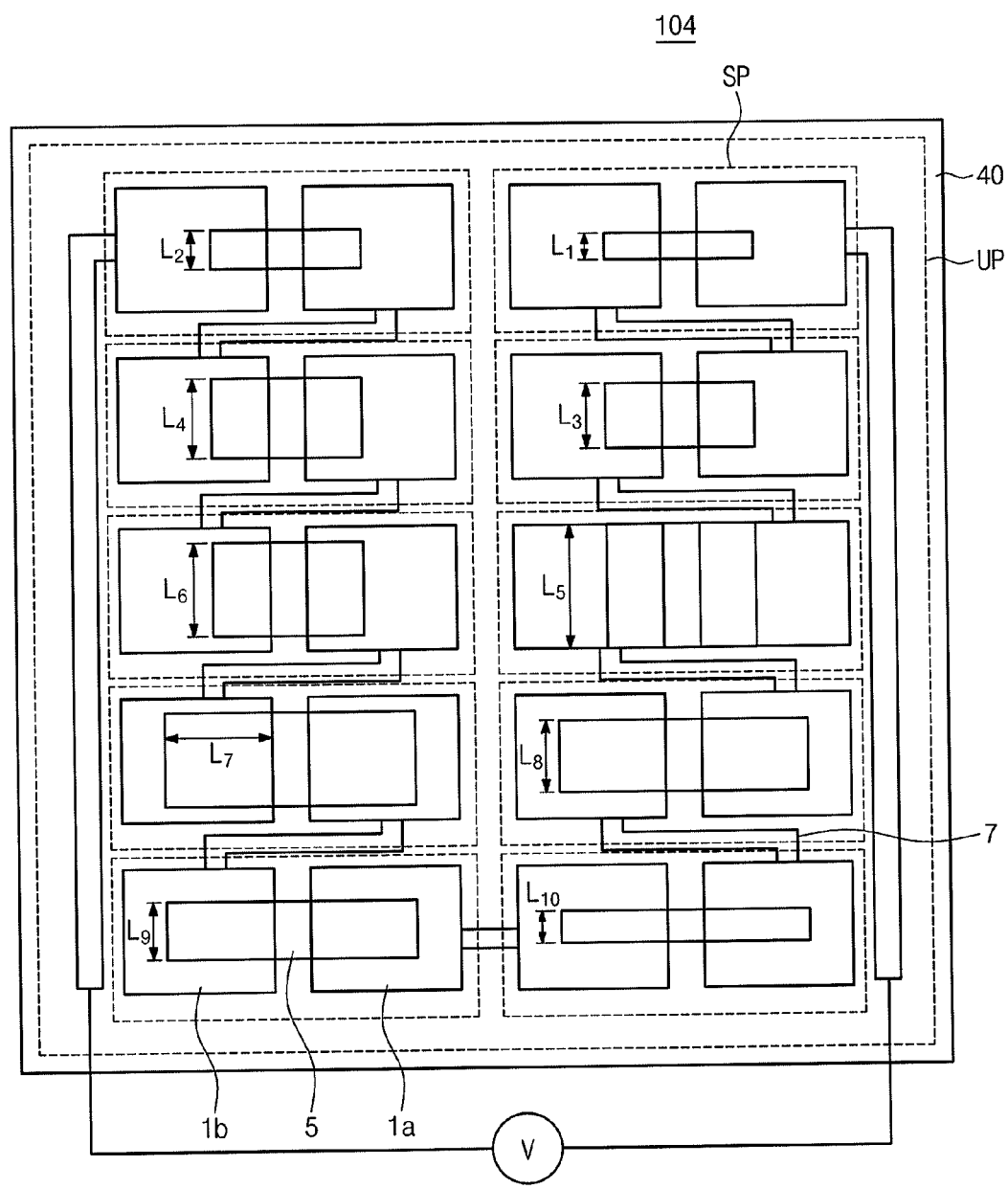
FIG. 7 illustrates a perspective view of a photodetector according to a fifth embodiment.

FIG. 7 illustrates a perspective view of a photodetector according to a fifth embodiment.

Referring to FIG. 7, in a photodetector 104 according to a fifth embodiment, a substrate 1 may include a unit pixel area UP formed of a plurality of sub pixel areas SP. Photodetectors similar to a photodetector of FIG. 6B may be disposed at the sub pixel areas SP, respectively. That is, first and second conductive sub-patterns 1a and 1b, the intermediate layer 3, and the second conductive pattern 5 may be disposed at each of the sub pixel areas SP. A length Li (i being 1 to 10) of at least one side of the second conductive pattern 5 overlapping the first and second conductive sub-patterns 1a and 1b may be different according to a corresponding sub pixel area. That is, lengths L1 to L10 of sides of the second conductive patterns 5 may be different from one another. In this case, one unit pixel area UP may absorb light having a plurality of wavelengths for which the lengths satisfy equation 1, so that photo absorption factor and photosensitivity is improved. One of the first and second conductive sub-patterns 1a and 1b in a unit pixel area UP may be connected with one of the first and second sub-conductive patterns 1a and 1b in another unit pixel area UP through a connection pattern 7.

Figure 8A:
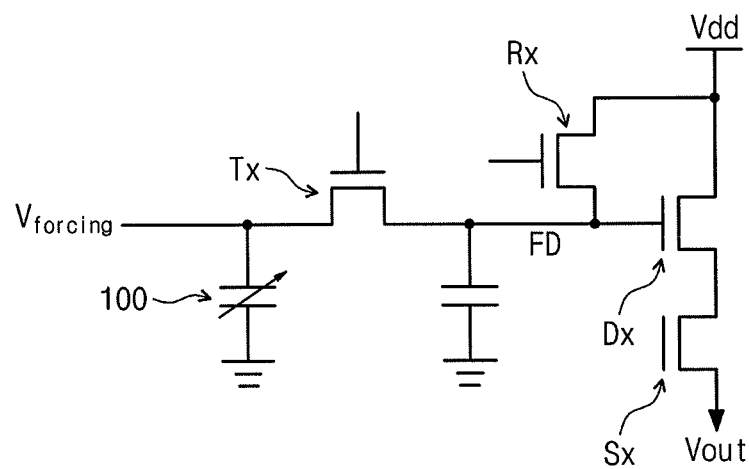
FIGS. 8A to 8C illustrate equivalent circuit diagrams of image sensors including a photodetector.
Figure 8B:
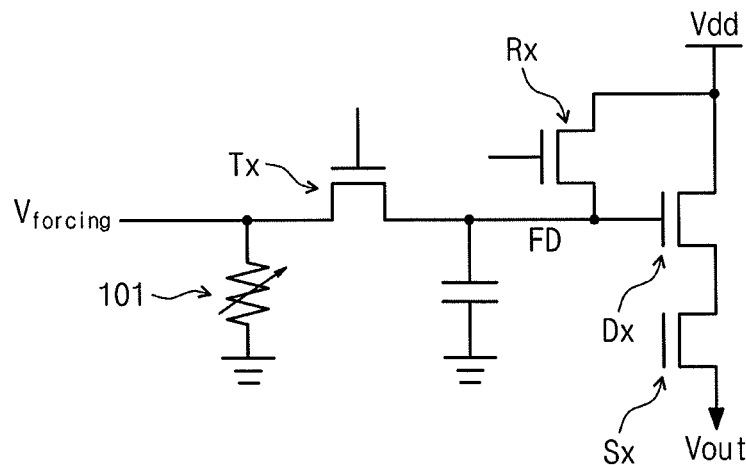
Figure 8C:
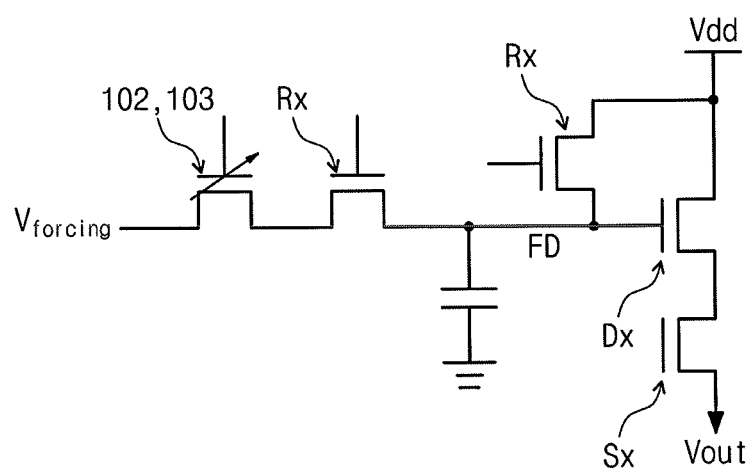

FIGS. 8A to 8C illustrate equivalent circuit diagrams of image sensors including a photodetector according to embodiments.

Referring to FIG. 8A, a unit pixel of an image sensor may include a capacitor type photodetector 100 according to the first embodiment, a transfer transistor Tx, a selection transistor Sx, a reset transistor Rx, and an access transistor Ax. A drain of the transfer transistor Tx may be understood as a floating diffusion area FD. The floating diffusion area FD may be a source of the reset transistor Rx. The floating diffusion area FD may be electrically connected with a selection gate of the selection transistor Sx. The selection transistor Sx and the reset transistor Rx may be connected in series. The selection transistor Sx may be connected to the access transistor Ax.

The image sensor may include a resistor type photodetector 101 of a second embodiment as illustrated in FIG. 8B or a transistor type photodetector 102/103 of a third/fourth embodiment as illustrated in FIG. 8C.

Figure 9:
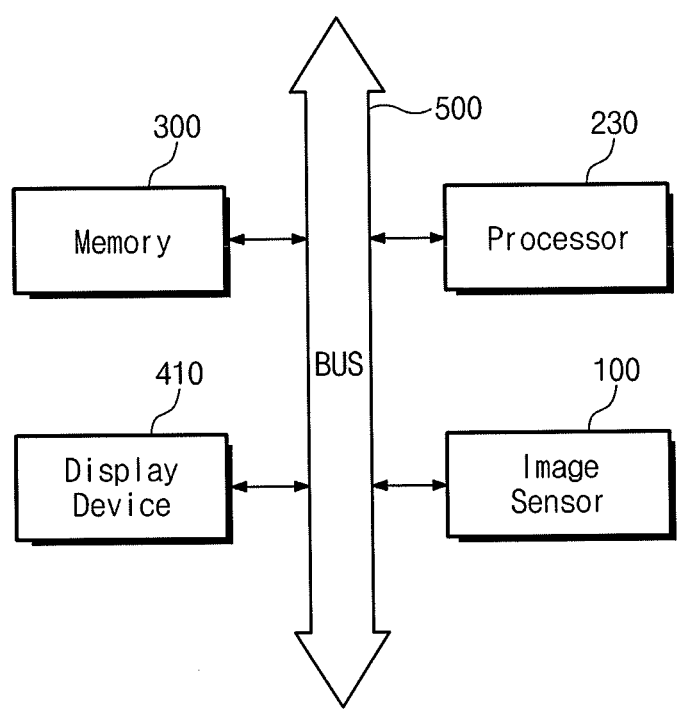
FIG. 9 illustrates a block diagram of an electronic device including an image sensor according to an embodiment.

FIG. 9 illustrates a block diagram of an electronic device including an image sensor according to an embodiment. An electronic device of FIG. 9 may be a digital camera or a mobile device.

Referring to FIG. 9, a digital camera system may include an image sensor 100, a processor 200, a memory 300, a display 400, and a bus 500. As illustrated in FIG. 9, the image sensor 100 may capture external image information in response to a control of the processor 200. The processor 200 may store the captured image information at the memory 300 through the bus 500. The processor 200 may output image information stored at the memory 300 to the display 400.

Figure 10:
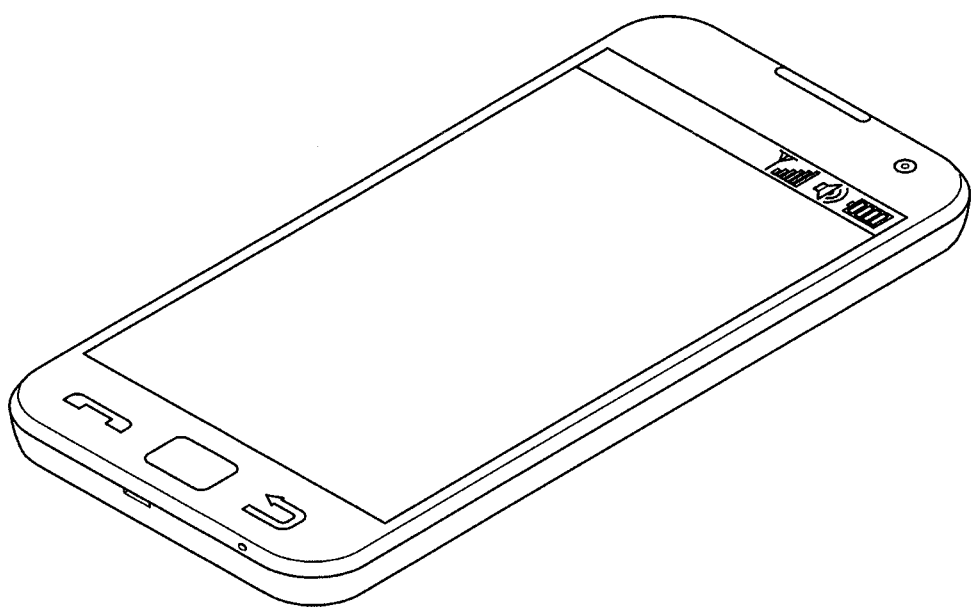
FIGS. 10 to 14 illustrate schematic diagrams of multimedia devices to which an image capture device according to an embodiment is applied.
Figure 11:
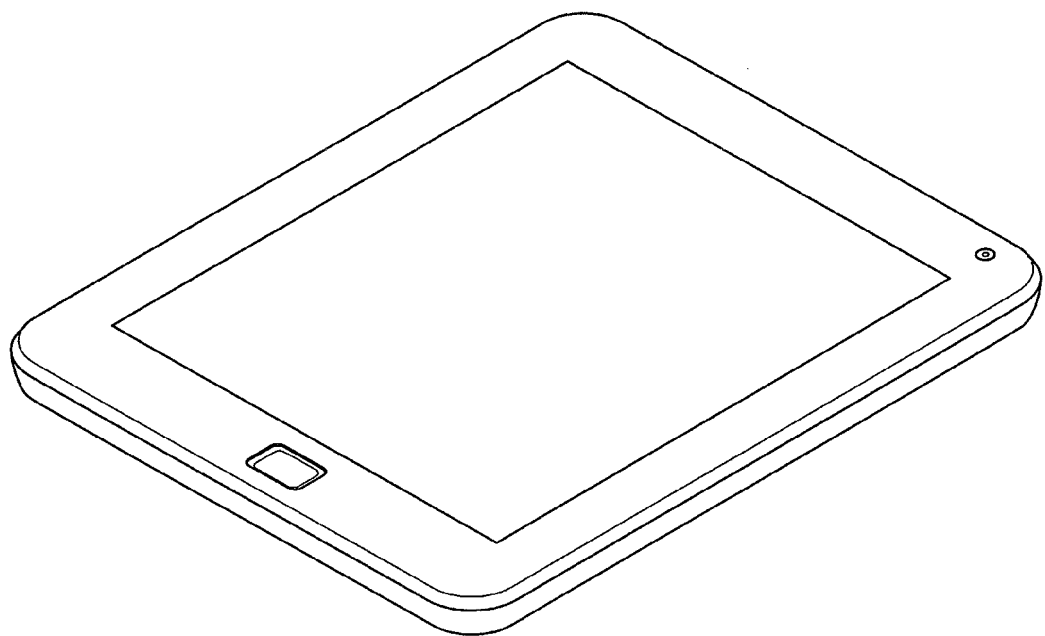
Figure 12:
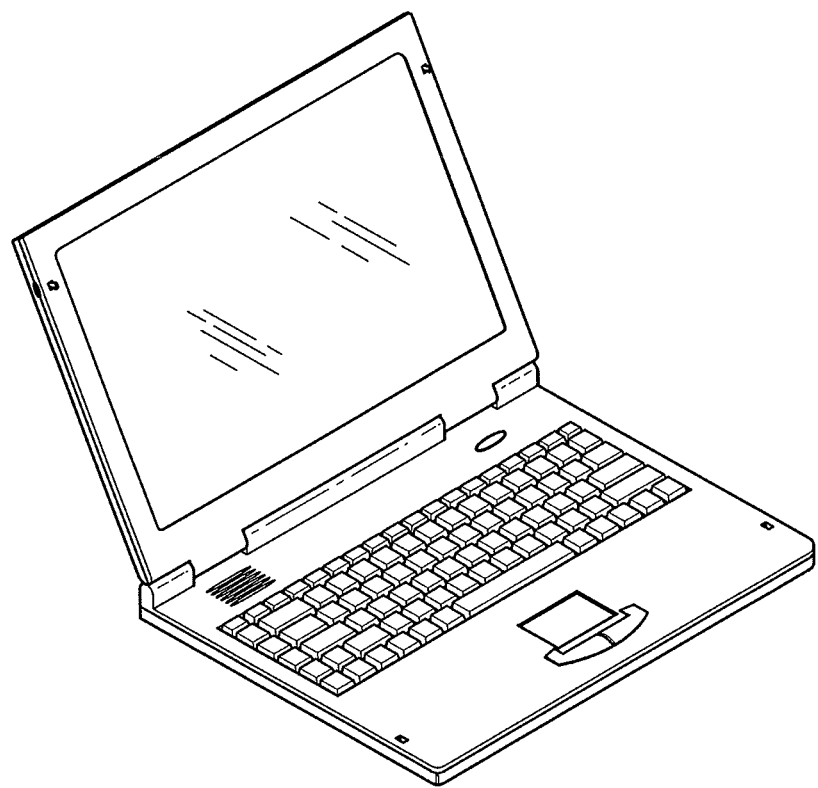
Figure 13:
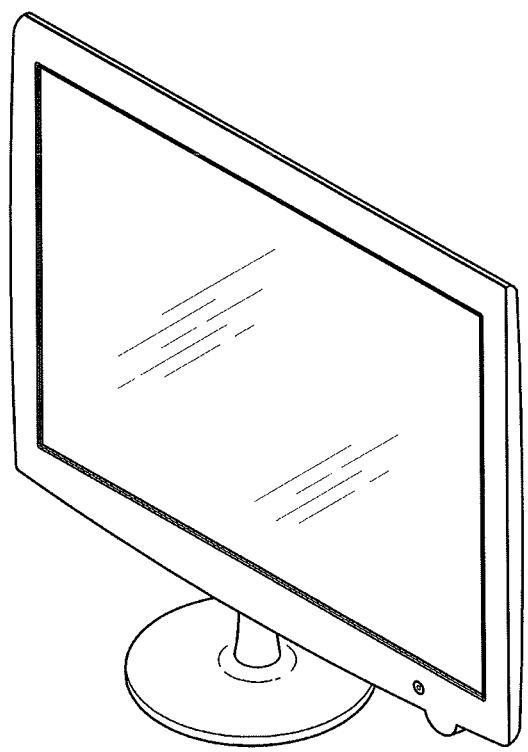
Figure 14:
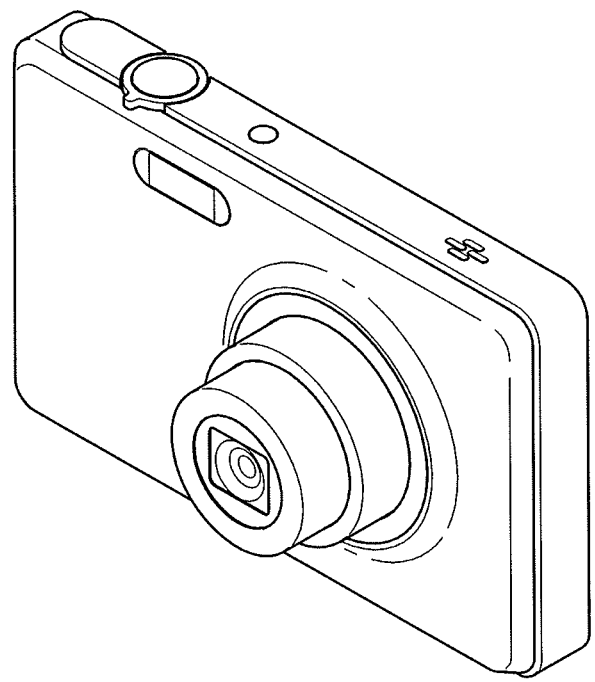

FIGS. 10 to 14 illustrate schematic diagrams of multimedia devices to which an image capture device according to an embodiment is applied. An image sensor according to an embodiment may be applicable to various multimedia devices having an image capture function. For example, the image sensor may be applied to a mobile or smart phone 2000 as illustrated in FIG. 10 and a tablet or smart tablet 3000 as illustrated in FIG. 11. Also, an image capture device 300 or 400 according to an embodiment may be applied to a notebook computer 4000 as illustrated in FIG. 12 and to a television or smart television 5000 as illustrated in FIG. 13. The image sensor may be applied to a digital camera or camcorder 6000 as illustrated in FIG. 14.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photodetector, comprising:
   a first conductive pattern and a second conductive pattern sequentially stacked;
   an intermediate layer interposed between the first conductive pattern and the second conductive pattern, the intermediate layer detecting an electromagnetic wave having a wavelength λ incident thereon;
   a source electrode and a drain electrode adjacent to both sides of the intermediate layer, respectively, and spaced apart from the first and second conductive patterns; and
   a gate insulation film interposed between the first conductive pattern and the intermediate layer or between the second conductive pattern and the intermediate layer,
   wherein a length L of at least one side of the second conductive pattern that overlaps the first conductive pattern and the intermediate layer satisfies equation 1, $$L = \lambda/2n_{\mathit{eff}} \quad (1)$$

wherein the $n_{\mathit{eff}}$ is an effective refractive index of a surface plasmon waveguide formed of the first conductive pattern, the intermediate layer, and the second conductive pattern during a surface plasmon resonance, and
   wherein heat generated in the intermediate layer by the electromagnetic wave through a surface plasmon focusing phenomenon causes a variation in the intermediate layer such that a varied current is detected.

2. The photodetector as claimed in claim 1, wherein the intermediate layer is one of silicon, germanium, poly silicon, poly germanium, amorphous silicon, amorphous germanium, silicon oxide, silicon nitride, silicon oxide nitride, and an amorphous or crystalline phase change film including a Chalcogenide element.

3. The photodetector as claimed in claim 1, wherein a real value of a dielectric constant of the first and second conductive patterns at the wavelength λ of the electromagnetic wave is a negative number.

4. The photodetector as claimed in claim 3, wherein the first and second conductive patterns are formed of at least one of gold, aluminum, silver, tungsten, copper, impurity-doped silicon, metal silicide, and crystalline alloy including a Chalcogenide element.

5. The photodetector as claimed in claim 1, further comprising:
   a substrate including a unit pixel area formed of a plurality of sub pixel areas,
   wherein the first conductive pattern, the intermediate layer, and the second conductive pattern are disposed at each of the sub pixel areas, and
   wherein a first length $L_1$ of a first side and a first wavelength $\lambda_1$ of the electromagnetic wave associated with a first sub pixel area are different from a second length $L_2$ of a second side and a second wavelength $\lambda_2$ of the electromagnetic wave associated with a second sub pixel area.

6. The photodetector as claimed in claim 5, wherein the first conductive pattern of the first sub pixel area is connected with the first conductive pattern of a second sub pixel area.

7. The photodetector as claimed in claim 5, wherein the first conductive pattern is common to all sub pixel areas.

8. The photodetector as claimed in claim 1, wherein the length L is shorter than the wavelength λ.

9. The photodetector as claimed in claim 1, wherein the electromagnetic wave is wave-guided along a surface between the first conductive pattern overlapping with the second conductive pattern and the intermediate layer and a surface between the second conductive pattern overlapping with the first conductive pattern and the intermediate layer by a surface plasmon phenomenon.

10. The photodetector as claimed in claim 1, wherein the variation in the intermediate layer is in electric resistance, conductivity, dielectric constant, or charge mobility.

11. The photodetector as claimed in claim 1, wherein the second conductive pattern is a polygonal where the second conductive pattern overlaps the first conductive layer and the intermediate layer.

12. The photodetector as claimed in claim 1, wherein the second conductive pattern is circular where the second conductive pattern overlaps the first conductive pattern and the intermediate layer.

13. The photodetector as claimed in claim 1, wherein the wavelength $\lambda$ is a first wavelength $\lambda_1$ to be detected, the second conductive pattern having another side that overlaps the first conductive pattern and the intermediate layer that has a second length $L_2$ satisfying equation 1 for a second wavelength $\lambda_2$ to be detected.

14. An image sensor, comprising:
a photodetector in claim 1; and
a reset transistor, a source follower transistor, a selection transistor and a transfer transistor electrically connected with the photodetector to transfer the varied current.

15. The image sensor as claimed in claim 14, further comprising:
a micro lens disposed on the photodetector.

16. The image sensor as claimed in claim 14, wherein no color filter is between the micro lens and the photodetector.

17. A photodetector, comprising:
a first conductive pattern;
an intermediate layer on the first conductive pattern, the intermediate layer detecting an electromagnetic wave having a wavelength $\lambda$ incident thereon;
a second conductive pattern on the intermediate layer, the second conductive pattern covering a smaller surface area than the first conductive pattern and the intermediate layer;
a source electrode and a drain electrode adjacent to both sides of the intermediate layer, respectively, and spaced apart from the first and second conductive patterns; and
a gate insulation film interposed between the first conductive pattern and the intermediate layer or between the second conductive pattern and the intermediate layer,
wherein a length L of at least one side of the second conductive pattern that overlaps the first conductive pattern and the intermediate layer satisfies equation 1, $$L=\lambda/2n_{\mathit{eff}} \quad (1)$$

wherein the $n_{\mathit{eff}}$ is an effective refractive index of a surface plasmon waveguide formed of the first conductive pattern, the intermediate layer, and the second conductive pattern during a surface plasmon resonance, and wherein heat generated in the intermediate layer, when the electromagnetic wave having the wavelength $\lambda$ is incident thereon, generates a current variation.

18. The photodetector as claimed in claim 17, wherein the wavelength $\lambda$ is a first wavelength $\lambda_1$ in a range of electromagnetic wavelengths to be detected, the second conductive pattern having another side having a second length $L_2$ satisfying equation 1 for a second wavelength $\lambda_2$ in the range of electromagnetic wavelengths to be detected.

* * * * *